US010621771B2

United States Patent
Matts et al.

(10) Patent No.: US 10,621,771 B2
(45) Date of Patent: *Apr. 14, 2020

(54) METHODS FOR AGE APPEARANCE SIMULATION

(71) Applicant: The Procter & Gamble Company, Cincinnati, OH (US)

(72) Inventors: Paul Jonathan Matts, Addlestone (GB); Brian Michael D'Alessandro, Chatham, NJ (US)

(73) Assignee: The Procter & Gamble Company, Cincinnati, OH (US)

( * ) Notice: Subject to any disclaimer, the term of this patent is extended or adjusted under 35 U.S.C. 154(b) by 203 days.

This patent is subject to a terminal disclaimer.

(21) Appl. No.: 15/465,166

(22) Filed: Mar. 21, 2017

(65) Prior Publication Data
US 2018/0276869 A1  Sep. 27, 2018

(51) Int. Cl.
*G06T 13/40* (2011.01)
*G06F 17/12* (2006.01)
(Continued)

(52) U.S. Cl.
CPC ........... *G06T 13/40* (2013.01); *G06F 17/12* (2013.01); *G06F 30/20* (2020.01); *G06K 9/00281* (2013.01); *G06K 9/00288* (2013.01); *G06Q 30/0271* (2013.01); *G06Q 30/0282* (2013.01); *G06Q 30/0631* (2013.01);
(Continued)

(58) Field of Classification Search
CPC .......... G06T 13/40; G06T 2207/30201; G06K 9/00221; G06K 9/00268; G06K 9/00281; G06K 9/00288; G06K 2009/00322
See application file for complete search history.

(56) References Cited

U.S. PATENT DOCUMENTS 4,276,570 A   6/1981  Burson et al.
5,850,463 A  12/1998  Horii
(Continued)

FOREIGN PATENT DOCUMENTS

CN   1870047 A   11/2006
CN  101556699 A   10/2009
(Continued)

OTHER PUBLICATIONS

Y. Fu, G. Guo, and T. S. Huang, "Age synthesis and estimation via faces: A survey," Pattern Analysis and Machine Intelligence, IEEE Transactions on, vol. 32, No. 11, pp. 1955-1976, 2010.
(Continued)

*Primary Examiner* — Antonio A Caschera
(74) *Attorney, Agent, or Firm* — John G. Powell

(57) ABSTRACT

Methods and systems for age appearance simulation of a consumer. The method includes receiving an image of the consumer (including a face of the consumer), determining an ethnicity of the consumer, determining an age of the patient, and determining a desired simulated age of the consumer. An altered image to represent the desired simulated age of the consumer may then be created, where altering the image includes utilizing a statistical ethnic aging model to alter at least one of a shape of the face, a color of the face, and a texture of the face. The altered image the first altered image may be provided for display to the consumer.

15 Claims, 9 Drawing Sheets

(51) Int. Cl.
- *G06K 9/00* (2006.01)
- *G06T 11/60* (2006.01)
- *G06Q 30/02* (2012.01)
- *G09B 5/02* (2006.01)
- *G09B 19/00* (2006.01)
- *G06Q 30/06* (2012.01)
- *G06F 30/20* (2020.01)

(52) U.S. Cl.
CPC ............... *G06T 11/60* (2013.01); *G09B 5/02* (2013.01); *G09B 19/00* (2013.01)

(56) References Cited

U.S. PATENT DOCUMENTS

| | | | |
|---|---|---|---|
| 6,556,196 | B1 | 4/2003 | Blanz et al. |
| 6,571,003 | B1 | 5/2003 | Hillebrand et al. |
| 6,619,860 | B1 | 9/2003 | Simon |
| 6,734,858 | B2 | 5/2004 | Attar et al. |
| 6,761,697 | B2 | 7/2004 | Rubinstenn et al. |
| 6,959,119 | B2 | 10/2005 | Hawkins et al. |
| 7,200,281 | B2 | 4/2007 | Zhang et al. |
| 7,634,103 | B2 | 12/2009 | Rubinstenn et al. |
| 8,014,589 | B2 | 9/2011 | del Valle |
| 8,094,186 | B2 | 1/2012 | Fukuoka et al. |
| 8,391,639 | B2 | 3/2013 | Hillebrand et al. |
| 8,401,300 | B2 | 3/2013 | Jiang et al. |
| 8,491,926 | B2 | 7/2013 | Mohammadi et al. |
| 8,550,818 | B2 | 10/2013 | Fidaleo et al. |
| 8,666,770 | B2 | 3/2014 | Maes et al. |
| 8,725,560 | B2 | 5/2014 | Aarabi |
| 2001/0037191 | A1 | 11/2001 | Furuta et al. |
| 2003/0065255 | A1 | 4/2003 | Giacchetti et al. |
| 2003/0065589 | A1 | 4/2003 | Giacchetti et al. |
| 2003/0198402 | A1 | 10/2003 | Zhang |
| 2004/0170337 | A1 | 9/2004 | Simon et al. |
| 2004/0213454 | A1 | 10/2004 | Lai et al. |
| 2004/0223631 | A1* | 11/2004 | Waupotitsch ...... G06K 9/00208 382/118 |
| 2006/0023923 | A1 | 2/2006 | Geng |
| 2006/0257041 | A1 | 11/2006 | Kameyama et al. |
| 2006/0274071 | A1 | 12/2006 | Bazin |
| 2007/0052726 | A1* | 3/2007 | Wright ...................... G06T 11/00 345/629 |
| 2007/0053940 | A1 | 3/2007 | Huang et al. |
| 2007/0070440 | A1 | 3/2007 | Li et al. |
| 2007/0229498 | A1 | 10/2007 | Matusik et al. |
| 2008/0194928 | A1 | 8/2008 | Bandic |
| 2008/0212894 | A1 | 9/2008 | Demirli |
| 2008/0316227 | A1 | 12/2008 | Fleury et al. |
| 2009/0028380 | A1* | 1/2009 | Hillebrand .............. G06T 11/60 382/100 |
| 2010/0185064 | A1 | 7/2010 | Bandic |
| 2010/0189342 | A1 | 7/2010 | Parr et al. |
| 2011/0064331 | A1 | 3/2011 | Andres del Valle |
| 2011/0249891 | A1 | 10/2011 | Li |
| 2012/0253755 | A1 | 10/2012 | Gobel |
| 2013/0089245 | A1 | 4/2013 | Yamazaki et al. |
| 2013/0169621 | A1 | 7/2013 | Mei et al. |
| 2013/0271451 | A1 | 10/2013 | Tong |
| 2013/0325493 | A1 | 12/2013 | Wong et al. |
| 2014/0219526 | A1 | 8/2014 | Linguraru et al. |
| 2014/0226896 | A1 | 8/2014 | Imai |
| 2014/0304629 | A1 | 10/2014 | Cummins et al. |
| 2014/0323873 | A1 | 10/2014 | Cummins et al. |
| 2015/0178554 | A1 | 6/2015 | Kanaujia et al. |
| 2016/0314616 | A1 | 10/2016 | Su |

FOREIGN PATENT DOCUMENTS

| | | | | |
|---|---|---|---|---|
| EP | 1297781 | A1 | 4/2003 | |
| EP | 1030267 | B1 | 1/2010 | |
| GB | 2424332 | * | 9/2006 | ............ H04N 5/262 |
| GB | 2424332 | A | 9/2006 | |
| WO | 2003049039 | A1 | 6/2003 | |
| WO | 2006005917 | A1 | 1/2006 | |
| WO | 2007044815 | A2 | 4/2007 | |
| WO | 2011146321 | A2 | 11/2011 | |
| WO | 2013104015 | A1 | 7/2013 | |
| WO | 2014122253 | A2 | 8/2014 | |
| WO | WO2015017687 | A2 | 2/2015 | |

OTHER PUBLICATIONS

B. Tiddeman, M. Burt, and D. Perret, "Prototyping and transforming facial textures for perception research," Computer Graphics and Applications, IEEE, vol. 21, No. 5, pp. 42-50, 2001.

D. M. Burt and D. I. Perrett, "Perception of age in adult Caucasian male faces: Computer graphic manipulation of shape and colour information," Proceedings of the Royal Society of London. Series B: Biological Sciences, vol. 259, No. 1355, pp. 137-143, 1995.

A. Lanitis, C. J. Taylor, and T. F. Cootes, "Toward automatic simulation of aging effects on face images," IEEE Transactions on Pattern Analysis and Machine Intelligence, vol. 24, No. 4, pp. 442-455, Apr. 2002.

Z. Liu, Z. Zhang, and Y. Shan, "Image-based surface detail transfer," Computer Graphics and Applications, IEEE, vol. 24, No. 3, pp. 30-35, 2004.

E. Patterson, K. Ricanek, M. Albert, and E. Boone, "Automatic representation of adult aging in facial images," in Proc. IASTED Int'l Conf. Visualization, Imaging, and Image Processing, 2006, pp. 171-176.

T. J. Hutton, B. F. Buxton, P. Hammond, and H. W. Potts, "Estimating average growth trajectories in shape-space using kernel smoothing," Medical Imaging, IEEE Transactions on, vol. 22, No. 6, pp. 747-753, 2003.

D. Dean, M. G. Hans, F. L. Bookstein, and K. Subramanyan, "Three-dimensional Bolton-Brush Growth Study landmark data: ontogeny and sexual dimorphism of the Bolton standards cohort," 2009.

J. H. Langlois and L. A. Roggman, "Attractive faces are only average," Psychological science, vol. 1, No. 2, pp. 115-121, 1990.

Y. H. Kwon and N. da Vitoria Lobo, "Age classification from facial images," in Computer Vision and Pattern Recognition, 1994. Proceedings CVPR'94., 1994 IEEE Computer Society Conference on, 1994, pp. 762-767.

P. A. George and G. J. Hole, "Factors influencing the accuracy of age estimates of unfamiliar faces," Perception-London-, vol. 24, pp. 1059-1059, 1995.

I. Pitanguy, F. Leta, D. Pamplona, and H. I. Weber, "Defining and measuring aging parameters," Applied Mathematics and Computation, vol. 78, No. 2-3, pp. 217-227, Sep. 1996.

Y. Wu, P. Kalra, and N. M. Thalmann, "Simulation of static and dynamic wrinkles of skin," in Computer Animation'96. Proceedings, 1996, pp. 90-97.

P. N. Belhumeur, J. P. Hespanha, and D. Kriegman, "Eigenfaces vs. fisherfaces: Recognition using class specific linear projection," Pattern Analysis and Machine Intelligence, IEEE Transactions on, vol. 19, No. 7, pp. 711-720, 1997.

M. J. Jones and T. Poggio, "Multidimensional morphable models," in Computer Vision, 1998. Sixth International Conference on, 1998, pp. 683-688.

I. Pitanguy, D. Pamplona, H. I. Weber, F. Leta, F. Salgado, and H. N. Radwanski, "Numerical modeling of facial aging," Plastic and reconstructive surgery, vol. 102, No. 1, pp. 200-204, 1998.

V. Blanz and T. Vetter, "A morphable model for the synthesis of 3D faces," in Proceedings of the 26th annual conference on Computer graphics and interactive techniques, 1999, pp. 187-194.

L. Boissieux, G. Kiss, N. M. Thalmann, and P. Kalra, Simulation of skin aging and wrinkles with cosmetics insight. Springer, 2000.

T. F. Cootes, G. J. Edwards, and C. J. Taylor, "Active appearance models," IEEE Transactions on pattern analysis and machine intelligence, vol. 23, No. 6, pp. 681-685, 2001.

Y. Bando, T. Kuratate, and T. Nishita, "A simple method for modeling wrinkles on human skin," in Computer Graphics and Applications, 2002. Proceedings. 10th Pacific Conference on, 2002, pp. 166-175.

(56) References Cited

OTHER PUBLICATIONS

M. R. Gandhi, "A method for automatic synthesis of aged human facial images," McGill University, 2004.
A. Lanitis, C. Draganova, and C. Christodoulou, "Comparing different classifiers for automatic age estimation," Systems, Man, and Cybernetics, Part B: Cybernetics, IEEE Transactions on, vol. 34, No. 1, pp. 621-628, 2004.
S. R. Coleman and R. Grover, "The anatomy of the aging face: volume loss and changes in 3-dimensional topography," Aesthetic surgery journal, vol. 26, No. 1 suppl, pp. S4-S9, 2006.
Y. Fu and N. Zheng, "M-face: An appearance-based photorealistic model for multiple facial attributes rendering," Circuits and Systems for Video Technology, IEEE Transactions on, vol. 16, No. 7, pp. 830-842, 2006.
X. Geng, Z.-H. Zhou, Y. Zhang, G. Li, and H. Dai, "Learning from facial aging patterns for automatic age estimation," in Proceedings of the 14th annual ACM international conference on Multimedia, 2006, pp. 307-316.
N. Ramanathan and R. Chellappa, "Modeling age progression in young faces," in Computer Vision and Pattern Recognition, 2006 IEEE Computer Society Conference on, 2006, vol. 1, pp. 387-394.
C. J. Solomon, S. J. Gibson, and others, "A person-specific, rigorous aging model of the human face," Pattern Recognition Letters, vol. 27, No. 15, pp. 1776-1787, 2006.
K. Ueki, T. Hayashida, and T. Kobayashi, "Subspace-based age-group classification using facial images under various lighting conditions," in Automatic Face and Gesture Recognition, 2006. FGR 2006. 7th International Conference on, 2006, p. 6-pp.
A. M. Albert, K. Ricanek Jr, and E. Patterson, "A review of the literature on the aging adult skull and face: Implications for forensic science research and applications," Forensic Science International, vol. 172, No. 1, pp. 1-9, 2007.
X. Geng, Z.-H. Zhou, and K. Smith-Miles, "Automatic age estimation based on facial aging patterns," Pattern Analysis and Machine Intelligence, IEEE Transactions on, vol. 29, No. 12, pp. 2234-2240, 2007.
K. Scherbaum, M. Sunkel, H.-P. Seidel, and V. Blanz, "Prediction of Individual Non-Linear Aging Trajectories of Faces," in Computer Graphics Forum, 2007, vol. 26, pp. 285-294.
J. Suo, F. Min, S. Zhu, S. Shan, and X. Chen, "A multi-resolution dynamic model for face aging simulation," in Computer Vision and Pattern Recognition, 2007. CVPR'07. IEEE Conference on, 2007, pp. 1-8.
Y. Fu and T. S. Huang, "Human age estimation with regression on discriminative aging manifold," Multimedia, IEEE Transactions on, vol. 10, No. 4, pp. 578-584, 2008.
G. Guo, Y. Fu, C. R. Dyer, and T. S. Huang, "Image-based human age estimation by manifold learning and locally adjusted robust regression," Image Processing, IEEE Transactions on, vol. 17, No. 7, pp. 1178-1188, 2008.
F. Jiang and Y. Wang, "Facial aging simulation based on super-resolution in tensor space," in Image Processing, 2008. ICIP 2008. 15th IEEE International Conference on, 2008, pp. 1648-1651.
J. Park, Y. Tong, and A. K. Jain, "Face recognition with temporal invariance: A 3d aging model," in Automatic Face & Gesture Recognition, 2008. FG'08. 8th IEEE International Conference on, 2008, pp. 1-7.
N. Ramanathan and R. Chellappa, "Modeling shape and textural variations in aging faces," in Automatic Face & Gesture Recognition, 2008. FG'08. 8th IEEE International Conference on, 2008, pp. 1-8.

B. Guyuron, D. J. Rowe, A. B. Weinfeld, Y. Eshraghi, A. Fathi, and S. Iamphongsai, "Factors contributing to the facial aging of identical twins," Plastic and reconstructive surgery, vol. 123, No. 4, pp. 1321-1331, 2009.
G. Mu, G. Guo, Y. Fu, and T. S. Huang, "Human age estimation using bio-inspired features," in Computer Vision and Pattern Recognition, 2009. CVPR 2009. IEEE Conference on, 2009, pp. 112-119.
N. Ramanathan, R. Chellappa, and S. Biswas, "Computational methods for modeling facial aging: A survey," Journal of Visual Languages & Computing, vol. 20, No. 3, pp. 131-144, 2009.
J. Park, Y. Tong, and A. K. Jain, "Age-invariant face recognition," Pattern Analysis and Machine Intelligence, IEEE Transactions on, vol. 32, No. 5, pp. 947-954, 2010.
J. Suo, S.-C. Zhu, S. Shan, and X. Chen, "A compositional and dynamic model for face aging," Pattern Analysis and Machine Intelligence, IEEE Transactions on, vol. 32, No. 3, pp. 385-401, 2010.
K. Sveikata, I. Balciuniene, and J. Tutkuviene, "Factors influencing face aging. Literature review," Stomatologija, vol. 13, No. 4, pp. 113-115, 2011.
J. P. Farkas, J. E. Pessa, B. Hubbard, and R. J. Rohrich, "The science and theory behind facial aging," Plastic and Reconstructive Surgery—Global Open, vol. 1, No. 1, pp. e8-e15, 2013.
J. Gatherwright, M. T. Liu, B. Amirlak, C. Gliniak, A. Totonchi, and B. Guyuron, "The Contribution of Endogenous and Exogenous Factors to Male Alopecia: A Study of Identical Twins," Plastic and reconstructive surgery, vol. 131, No. 5, p. 794e-801e, 2013.
F. Durand and B. Freeman, "14: Image Warping and Morphing," presented at the 6.882 Advanced Computational Photography, MIT.
International Search Report and Written Opinion of the International Searching Authority, PCT/US2018/023219, dated Jun. 1, 2018, 13 pages.
Andreas Lanitis, Comparative Evaluation of Automatic Age-Progression Methodologies, EURASIP Journal on Advances in Signal Processing, vol. 2008, No. 1, Jan. 1, 2008, 10 pages.
Guodong Guo et al., A framework for joint estimation of age, gender and ethnicity on a large database, Image and Vision Computing, vol. 32, No. 10, May 10, 2014, pp. 761-770
International Search Report and Written Opinion of the International Searching Authority, PCT/US2018/023042, dated Jun. 6, 2018.
Sung Eun Choi et al., Age face simulation using aging functions on global and local features with residual images, Expert Systems with Applications, vol. 80, Mar. 7, 2017, pp. 107-125.
Xiangbo Shu et al., Age progression: Current technologies and applications, Neurocomputing, vol. 208, Oct. 1, 2016, pp. 249-261
Yun Fu et al., Age Synthesis and Estimation via Faces: A Survey, IEEE Transactions on Pattern Analysis and Machine Intelligence, vol. 32, No. 11, Nov. 1, 2010, pp. 1955-1976.
Fu et al., Learning Race from Face: A Survey, IEEE Transactions on Pattern Analysis and Machine Intelligence, vol. 36, No. 12, Dec. 1, 2014, pp. 2483-2509.
Wang et al., Combining Tensor Space Analysis and Active Appearance Models for Aging Effect Simulation on Face Images, IEEE Transactions on Systems, Man, and Cybernetics—Part B: Cybernetics, vol. 42, No. 4, Aug. 1, 2012, pp. 1107-1118.
U.S. Appl. No. 15/465,388, filed Mar. 21, 2017, Brian Michael D'Alessandro et al.

* cited by examiner

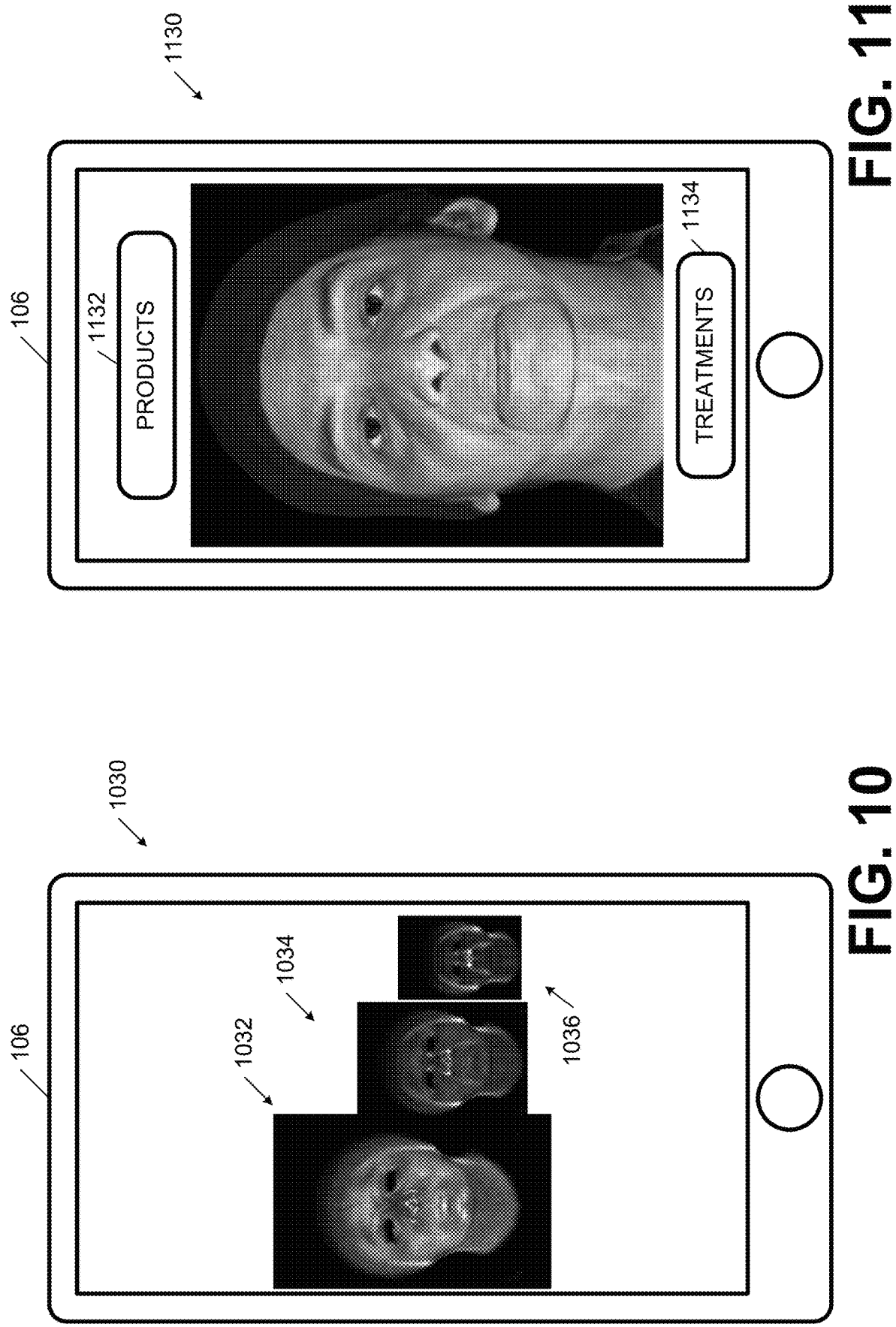

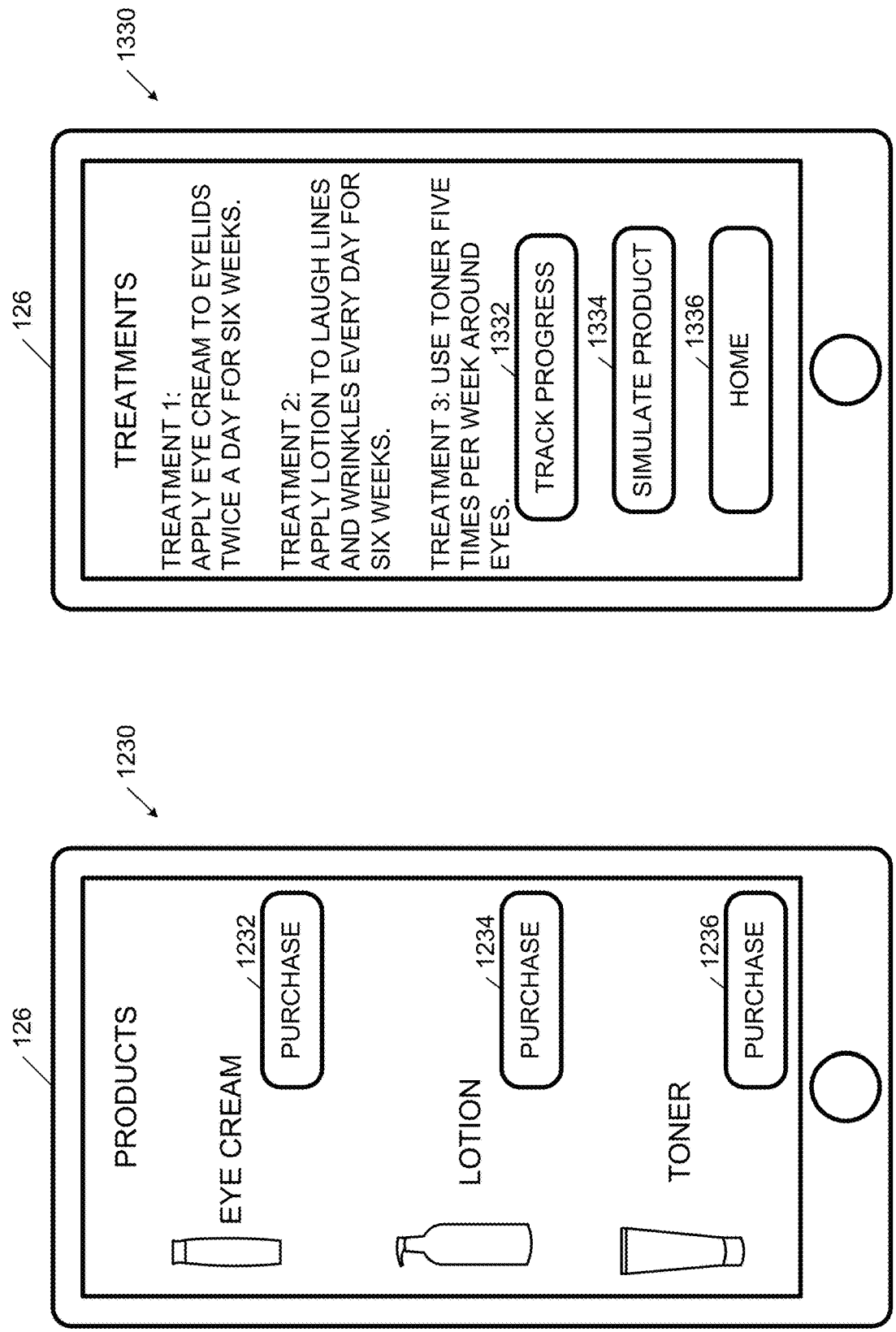

METHODS FOR AGE APPEARANCE SIMULATION

FIELD

The inventions described and claimed herein were made pursuant to a Joint Research Agreement between The Procter & Gamble Company and Canfield Scientific, Inc.

BACKGROUND

It is almost a universal desire in adult humans to look younger. As such, there are a multitude of products on the market today that promise to reduce the signs of aging. While many of these products have some effect in reducing the appearance of wrinkles, these solutions are typically not customized to the individual's needs. Additionally, current computing systems have been developed for age prediction and progression; however, these programs lack the ability to accurately determine and/or progress age appearance based on a plurality of criteria.

As an example, U.S. Pat. No. 6,734,858 ("the '858 Patent") describes a method and apparatus for use of computer aging to demonstrate a product benefit. The '858 Patent discloses that an image may be progressively aged to a predetermined period of time and a determination may be made regarding the effects of a product on that aging. However, the '858 Patent fails to address ethnic differences of aging or the ability to account for ethnic-dependent changes to color, shape, texture, etc., which occur to the face of an individual as the individual ages.

As another example, International application WO2006005917 ("the '917 Publication") describes a system and/or method for plausible aging of the human face. Specifically, the '917 Publication discloses that vector representations may be utilized for identifying and modifying an age of an individual in an image. Some embodiments determine relationships of generations of the same family. However, the '917 Publication fails to provide accuracies related to ethnic-dependent color changes, shape changes, and/or factors for accurately performing the algorithm described therein.

Conventional modeling techniques are unable to suitably age or de-age an individual from a starting age through at least one intermediate age to a final age continuously while maintaining the realism of gradual shape, color, and (most challengingly) texture changes over time. Thus, there is a need for an improved aging model and method of predicting age-based changes to appearance.

SUMMARY

Methods for age appearance simulation of an individual are provided. The methods include receiving an image of an individual, including a face of the individual, determining an ethnicity of the individual, and determining an age of the individual. Some embodiments include determining a desired simulated age of the individual and creating an altered image by altering the image to represent the desired simulated age of the individual, where altering the image includes using an ethnic aging model to alter at least one of the following: a shape of the face, a color of the face, and a texture of the face. In some instances, the methods also include providing the first altered image for display to a user.

In some instances, the method includes receiving an image of the individual, where the image includes a face of the individual, and where the image is configured as a three-dimensional image of the face of the individual.

In some instances, creating the altered image includes altering a landmark using a statistical ethnic shape model, altering the texture using a statistical ethnic texture model, or altering the color using a statistical ethnic color model.

Apparatuses and non-transitory computer-readable mediums involved in implementations of the aforementioned methods are also provided herein.

BRIEF DESCRIPTION OF THE DRAWINGS

FIG. 10 depicts an administrator interface for providing a plurality of multi-level model textures for age appearance simulation using a statistical ethnic texture model.

FIG. 11 depicts a user interface for displaying shape, color, texture, and/or product efficacy changes to an image for age appearance simulation using a statistical ethnic shape, color, texture and/or clinical product efficacy model(s).

FIG. 12 depicts a user interface for purchasing products.

FIG. 13 depicts a user interface for providing a detailed product treatment regimen to counter effects of predicted aging and progress tracking capability.

DETAILED DESCRIPTION

Figure 1:
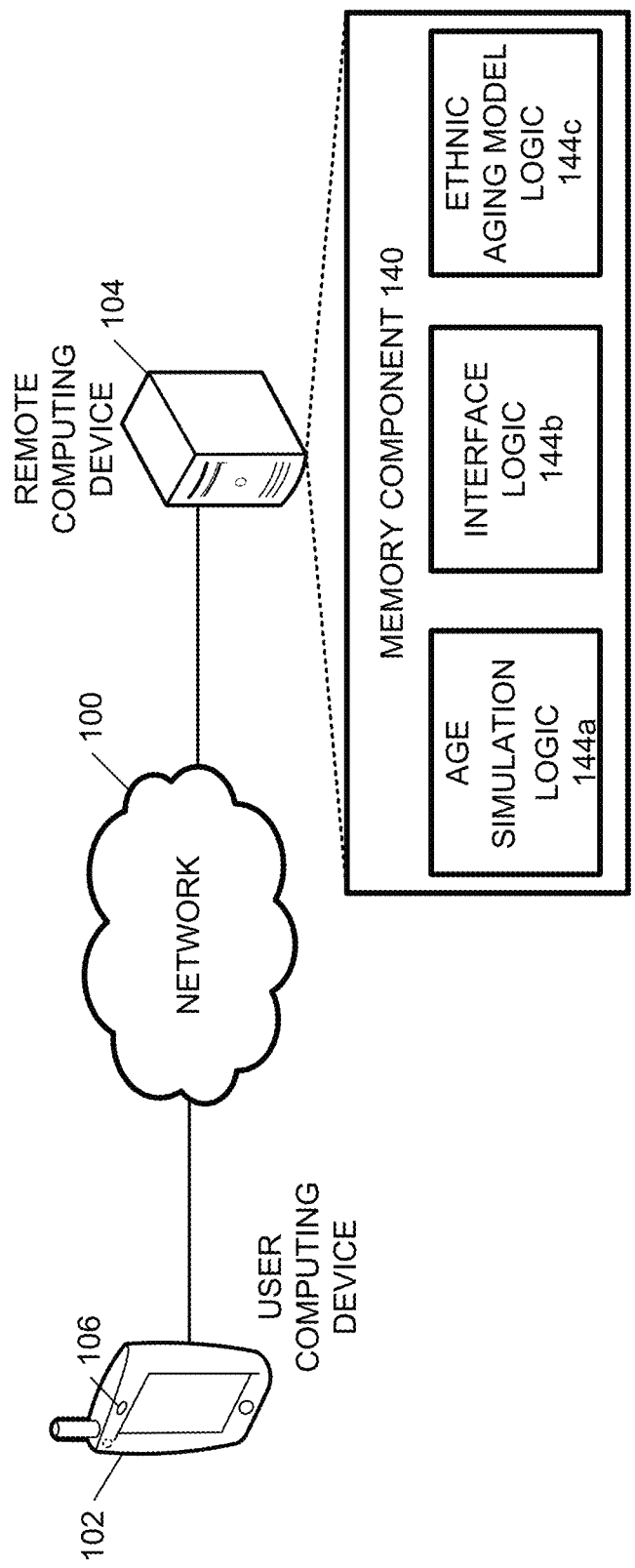
FIG. 1 depicts a system for age appearance simulation.

"Consumer" refers to a person upon whom the use of the age appearance prediction methods and systems herein is for cosmetic (i.e., non-medical) purposes.

"Cosmetic" herein means a non-medical method of providing a desired visual effect on an area of the human body. The visual cosmetic effect may be temporary, semi-permanent, or permanent.

"Cosmetic agent" means any substance, as well as any component thereof, intended to be rubbed, poured, sprinkled, sprayed, introduced into, or otherwise applied to a mammalian body or any part thereof to provide a cosmetic effect (e.g., cleansing, beautifying, promoting attractiveness, and/or altering the appearance). Cosmetic agents may include substances that are Generally Recognized as Safe (GRAS) by the US Food and Drug Administration and food additives.

"Cosmetic products" are products that include a cosmetic agent (e.g., skin moisturizers, lotions, perfumes, lipsticks, fingernail polishes, eye and facial makeup preparations, cleansing shampoos, hair colors, shave prep, and deodorants).

"Patient" refers to a person upon whom the use of the age appearance prediction methods and systems herein is for medical or medically related purposes.

"Skin care" means regulating and/or improving a skin condition. Some non-limiting examples include improving skin appearance and/or feel by providing a smoother, more even appearance and/or feel; increasing the thickness of one or more layers of the skin; improving the elasticity or resiliency of the skin; improving the firmness of the skin; and reducing the oily, shiny, and/or dull appearance of skin, improving the hydration status or moisturization of the skin, improving the appearance of fine lines and/or wrinkles, improving skin exfoliation or desquamation, plumping the skin, improving skin barrier properties, improving skin tone, reducing the appearance of redness, acne, rosacea, or skin blotches, and/or improving the brightness, radiancy, or translucency of skin.

"Skin care active" means a cosmetic agent that, when applied to skin, provides an acute and/or chronic benefit to skin or a type of cell commonly found therein. Skin care actives may regulate and/or improve skin or its associated cells (e.g., improve skin elasticity, hydration, skin barrier function, and/or cell metabolism).

"Skin care composition" means a composition that includes a skin care active and regulates and/or improves a skin condition.

"Treatments" refer to any cosmetic or medical skin care, including the application of products, skin care regimens, or skin procedures.

The systems and methods for age appearance simulation herein may be configured to provide a user with an aging and/or de-aging prediction and/or simulation experience. In some instances, the user provides an image of themselves along with gender, ethnicity, and/or age information, which can be combined with empirical/statistical, age-based facial shape and complexion (texture and/or color) data models to visually communicate how the user will age. With this insight, the user can make choices about their skin care treatments and/or procedures to provide the skin appearance benefit they desire. Additionally or alternatively, these models, when combined with clinically-based efficacy data could be used to simulate expected results (average responder, best responder, etc.), thereby helping a user make an informed choice on a suitable treatment. The term "simulation" includes the predictive nature of the functionality in both 2D and 3D spaces, as well as a projection of imagery (such as a 2D projection), as described herein.

Statistical ethnic models may be applied to at least one facial feature, at least one age feature, and/or shape to simulate aging/de-aging of the individual. After a simulated application of a treatment, an image of the user depicting the new simulated appearance of the individual may be provided. This process may also occur in conjunction with a simulation of the passing of time (e.g., what someone would look like 10 years from now with and without treatment).

FIG. 1 depicts an exemplary computing environment for age appearance simulation. As illustrated in FIG. 1, a network 100 is coupled to a user computing device 102 and a remote computing device 104. The network 100 may include any wide area network, local network, etc., with any combination of wired and/or wireless portions. As an example, the network 100 may include the internet, a public switch telephone network, a cellular network (such as 3G, 4G, LTE, etc.). Similarly, the network 100 may include local networks, such as a local area network, Wi-Fi, Bluetooth network, Zigbee, near field communication, combinations of these and the like.

The user computing device 102 may be configured as any computing device suitable for capturing images, communicating with the remote computing device 104, and/or providing one or more user interfaces to a user. For example, the user computing device 102 may be a smart phone, a personal computer, a laptop, a tablet, or a kiosk. While depicted in FIG. 1 as a mobile device, the user computing device 102 is not so limited. For example, the user computing device 102 may be configured to provide the analysis and data described herein, as well as dispense products, print treatments, and/or provide other tangibles, as well as accept payments in exchange for the tangibles.

The user computing device 102 may include an image capture device 106 for capturing digital images. As described in more detail below, the captured images may include a 3D and/or a 2D image. As such, the image capture device 106 may include one or more image sensors and/or lenses for capturing the desired data.

The remote computing device 104 may be configured to communicate with the user computing device 102 via the network 100. As such, the remote computing device 104 may include a server, personal computer, smart phone, laptop, notebook, kiosk, tablet, augmented/virtual reality headset, and the like. The remote computing device 104 may include a memory component 140 and other components, for example, as depicted in FIG. 1, which stores age simulation logic 144a, interface logic 144b, and ethnic aging model logic 144c. As described in more detail below, the age simulation logic 144a may be configured to analyze an image of an individual and perform age, appearance, or ethnicity prediction. The interface logic 144b may be configured to create one or more user interfaces that are provided to the user computing device 102. The ethnic aging model logic 144c may be configured to run one or more of the ethnic models described herein. In some instances, the age simulation logic 144a, the interface logic 144b, and/or the ethnic aging model logic 144c may perform some or all of the described functionality in the user computing device itself 102 and/or another computing device not depicted in FIG. 1.

The systems and methods described herein may be utilized for a consumer in the field of cosmetics (e.g., for skin care) or for a patient in the medical field. Collectively, patients and/or consumers may be referred to herein as "individual(s)." Embodiments related to the medical field include products for and/or methods relating to the treatment of a medical condition or medically-related aesthetic treatment, such as products and procedures that require operation by a health care professional; products used by a health care professional in the course of a medical diagnosis; products used in the treatment of a disease or other medical condition requiring treatment by a healthcare professional; products sold with a prescription; and the activities of cosmetic/plastic surgeons, dermatologists, general medical practitioners, medical spa staff, and pharmaceutical companies.

Figure 2:
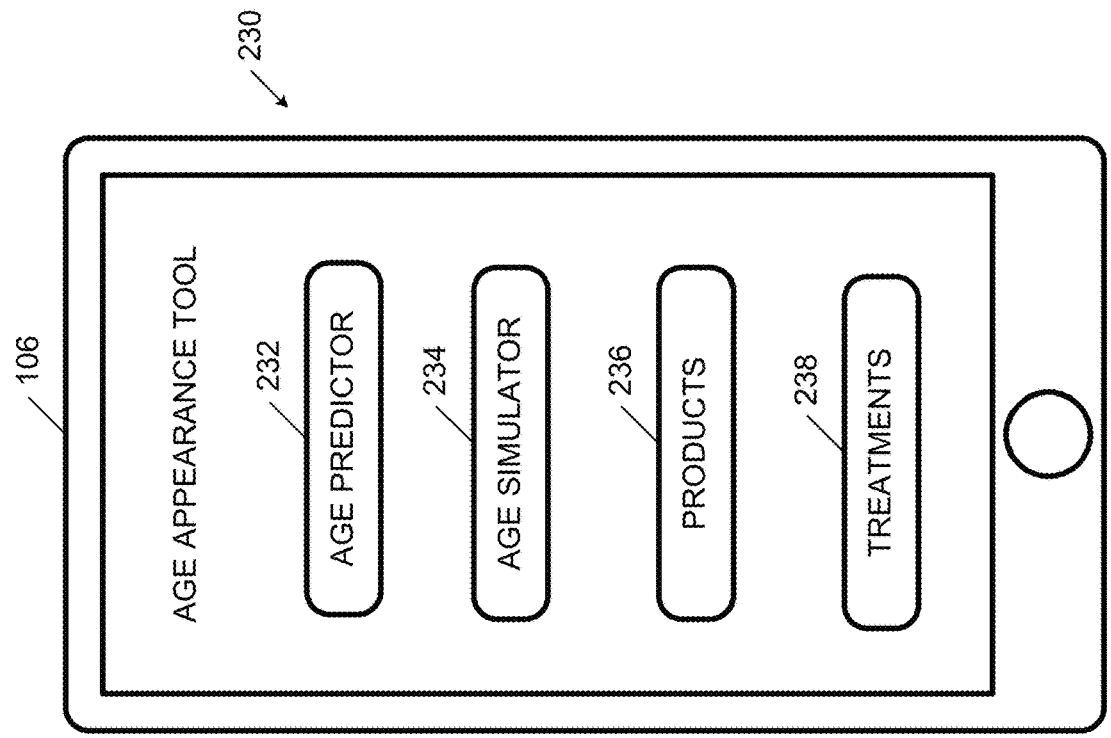
FIG. 2 depicts a user interface for providing aging and/or de-aging appearance simulation.

FIG. 2 depicts an exemplary user interface 230 for providing an age appearance simulation. As illustrated, the user interface 230 may include an age predictor option 232, an age simulator option 234, a products option 236, and a treatments option 238. In response to selection of the age predictor option 232, the model may be configured to provide age appearance prediction, as described in more detail. In response to selection of the age simulator option 234, one or more user interfaces may be provided to simulate aging of the individual. In response to selection of the products option 236, one or more products for an individual may be recommended to the user. In response to selection of the treatments option 238, one or more treatments for the individual may be recommended to the user. In some instances, the user interface 230 may include an ethnicity predictor option (not shown), which allows a user to select an ethnic appearance prediction.

It should be understood that methods described herein may include capturing an image of an individual, providing age simulation of an individual, and interacting with a user. Accordingly, the individual may include any person of which an image is captured and/or aging simulation is performed. The user may include any user of the user computing device 102. In some instances, the individual and the user are the same person, but need not necessarily be.

Figure 3:
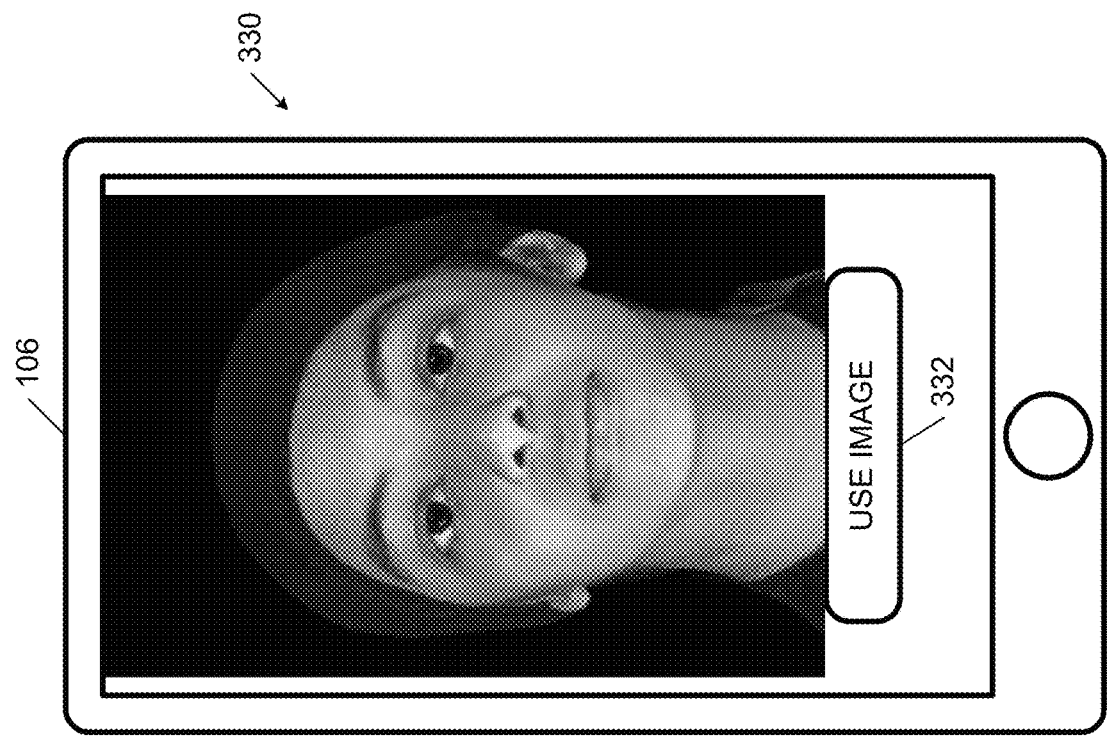
FIG. 3 depicts a user interface for capturing an image of an individual for age appearance simulation.

FIG. 3 depicts an exemplary user interface 330 for displaying an image of an individual for age appearance simulation. As illustrated, the user may capture and/or receive an image of an individual, which may be displayed in the user interface 330. A use image option 332 may be provided to utilize the image for age simulation, age prediction, and/or ethnicity prediction. The image may be captured via the image capture device 106 (FIG. 1) and/or may be downloaded, received via an electronic communication, etc.

In some instances, the image may be configured as a 3D image of the individual's face. For example, the image of an individual may be captured with a three-dimensional system (that may or may not be part of the user computing device 102). The user computing device 102, the remote computing device 104, and/or other device may perform preprocessing of the captured image, as desired. Preprocessing of the 2D or 3D image may include removing extraneous objects from a captured image; reorienting the image so that the facial features align with a predetermined model; landmarking facial features of the image; and adjusting the landmarks to be on substantially consistent positions for a plurality of individuals.

In some instances, a 3D image of an individual may be converted to a two-dimensional representation, for example, by projecting one or more landmarks from the three-dimensional image onto two dimensions from a front view and/or side view. Once the image is converted to (or captured as) a 2D image and/or is otherwise preprocessed, the image may be analyzed for wrinkle area and other age features in one or more regions of the face. For example, wrinkles in the periorbital region of the face may be determined and classified according to size. The image may also be analyzed for other age features such as visible spots on a standard and/or cross-polarized version of the image. Likewise, other features (pores, texture/color, acne, rosacea, etc.) may be detected using parallel-polarized or other imaging modalities.

Figure 4:
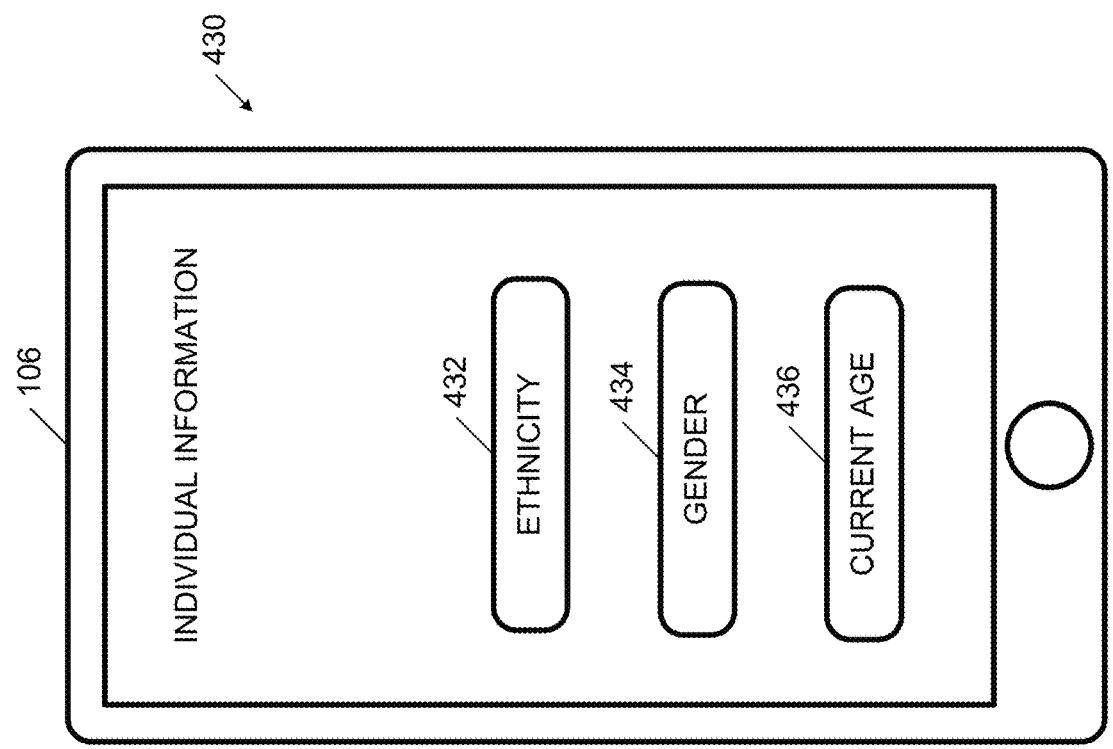
FIG. 4 depicts a user interface for receiving individual information (e.g., gender, ethnicity, age).

FIG. 4 depicts an exemplary user interface 430 that includes an ethnicity option 432, a gender option 434, and a current age option 436. It is to be appreciated that fewer or more criteria may be entered by a user. In response to selection of the ethnicity option 432, the user may input the ethnicity of an individual. In some instances, the interface 430 may permit a user to input ethnicity as a percentage of various separate ethnic groups. In this case, the expected changes produced by the statistical aging models for each ethnic group (shape, color, and/or texture, described below) would be combined using a weighted average proportional to the input ethnicities. This multi-ethnic expected change may then be used for simulation of the input image. In response to selection of the gender option 434, the user may input the gender of the individual. In response to selection of the current age option 436, the user may input the current age of the individual. In some instances, one or more options for user input may be automatically determined by the system from past user actions, image analysis, etc.

Figure 5:
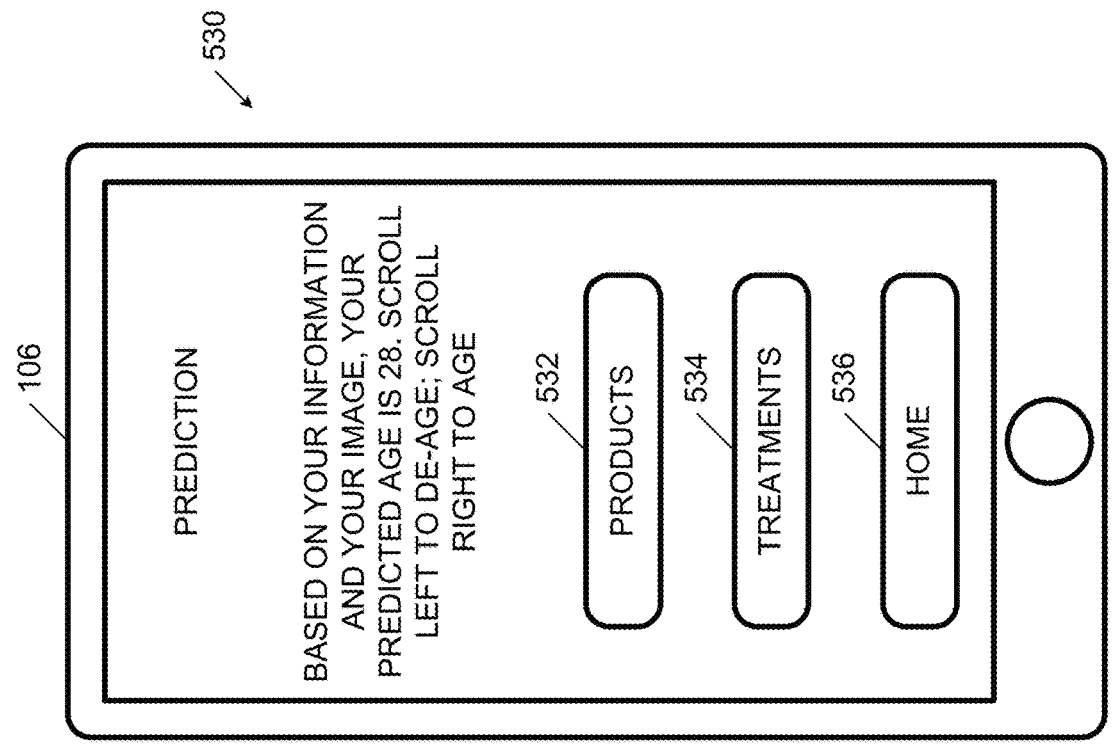
FIG. 5 depicts a user interface for providing an age appearance simulation.

FIG. 5 depicts an exemplary user interface 530 for providing an age prediction and an age appearance prediction/simulation. As illustrated, the user interface 530 may provide a simulation aging/de-aging of an individual. Specifically, the image of an individual may be aged and/or de-aged using statistical ethnic models (e.g., a statistical ethnic shape model, a statistical ethnic texture model, and/or a statistical ethnic color model), which may be performed by the remote computing device 104 and/or the user computing device 102.

The user interface 530 may include a products option 532, a treatments option 534, and/or a home option 536. In response to selection of the products option 532, one or more products may be provided for treating the expected aging changes. In response to selection of the treatments option 534, one or more treatment regimens may be provided. In response to selection of the home options 536, the interface may return to the user interface 230 to begin a new capture and analysis.

The user interface 530 may also display a predicted or apparent age of an individual based on analysis of the image. For example, corresponding left and right landmarks (such as eyes, ears, cheeks, etc.) may be averaged about a central vertical axis on the image (in this example it is assumed that the individual has substantial facial symmetry). Continuing with this example, age features such as wrinkles and spots, distances between facial features, ratios related to the distances, etc. may be determined and collected for determining the apparent age of the individual. In some instances, the vertical and/or horizontal distance between each pair of points on the landmarks can be measured and ratios between the distances calculated. Based on the selected age features, the ratios, the distances, and the ethnicity of the individual, the remote computing device 104 and/or the user computing device 102 can determine an apparent age.

As people age, they undergo shape changes to their face and create age features, at least some of which are unique to their ethnicity. For example, the distances between facial features (such as eyes, cheeks, and ears), the sizes of facial features, and the like may indicate the age of the individual, in light of the individual's ethnicity. By comparing the ratios and distances to an average person of that ethnicity at a plurality of different ages, the remote computing device 104 and/or the user computing device 102 may determine an apparent age. Additionally, the detected age features may be utilized to further determine the apparent age. Spot analysis scores, wrinkle analysis scores, landmark distances, landmark ratios, and absolute landmark coordinates may be combined to form a complete feature set representing the individual's face for use in one or more age prediction/simulation models (e.g., shape and texture/color models). Each feature may be normalized, for example, between [0, 1] based on its maximum and minimum value in the ethnic population.

To build a suitable age prediction model, the number of feature inputs to the model may be reduced to simplify the model and/or avoid over-fitting. In some instances, only the single highest-correlating wrinkle feature to age may be retained out of all possible wrinkle scores. Additionally, any feature with a correlation less than a predetermined threshold may be eliminated. In some instances, the threshold may be chosen to be about 0.5. In some instances one or more ethnic groups may have different thresholds, such as about 0.4 for the African ethnic group. Further, the remaining features may be input to a Correlation-based Feature Selection (CFS) algorithm to find features that highly correlate with age, yet are uncorrelated with each other. These steps reduce the number of features down to 8 or 9, depending on the ethnic group, while still maintaining good correlation with age. The optimal selected subset of features may be input into a Linear Regression classifier to develop a linear predictive model of age such as in the form:

$$\text{predicted age} = c + \sum_{i=0}^{n} w_i f_i$$

where n is the number of features in the model, $w_i$ and $f_i$ are the model weight and feature value for the ith feature, respectively, and c is a constant. To predict the age for any new individual (i.e., someone who was not previously part of the model), the relevant subset of features may be computed and then input into the equation above to calculate the predicted age.

The prediction models herein need not be limited to just simple linear regression models, but could be more advanced models that better represent feature trajectories across a range of ages, such as polynomial models, other non-linear models (smoothing splines, multivariate adaptive regression splines (MARS), etc.), neural networks, etc. Likewise, similar measurements and prediction models could be made to determine the ethnicity for that individual, either resulting in a single ethnic group prediction or some mixture of multiple ethnic groups.

Figure 6:
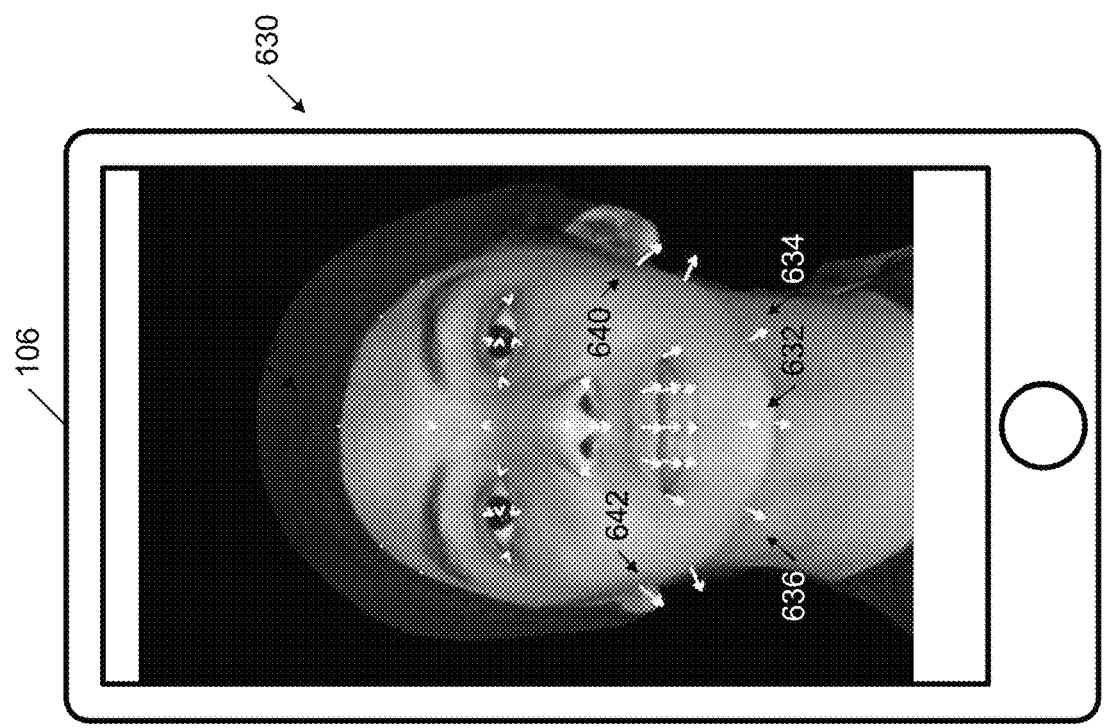
FIG. 6 depicts an interface for displaying landmark trajectory (i.e. shape) changes with age based upon a statistical ethnic aging model.

FIG. 6 depicts an exemplary interface 630 for mapping facial landmarks detected in a captured image and providing predicted trajectories of the facial features of the individual. In the example illustrated in FIG. 6, the arrows indicate the expected movement of facial landmarks as the individual ages. The direction and magnitude of each arrow may be determined from the ethnic shape model, based on the statistical analysis of a population of other individuals of the same ethnicity. As an example, an arrow 632 corresponding to the chin region of an individual indicates the expected movement of the chin region of the individual over time. In this example, the tail of the arrow 632 indicates the position of the chin region at a first age, and the head of the arrow 632 indicates where the chin region is expected to be after a predetermined number of years, based on the shape aging model of an average person of the same age and ethnicity. Similarly, arrows 634 and 636 illustrate the expected jaw line movement of the individual over time, as predicted by the model. In this example, arrows 640 and 642 illustrate expected movement of the individual's ears, as predicted by the model. Arrow 638 illustrates expected movement of a forehead landmark of the individual, as predicted by the model.

It should be understood that the arrows 632, 634, 636, 640, and 642 correspond to various facial landmarks where age is expected to alter the position of these facial features. The arrows illustrate the magnitude and direction of expected movement. Thus, the forehead arrow 638, for example, appears relatively short, because age is not expected to drastically affect that portion of the face for the ethnicity model depicted.

The remote computing device 104 may compare the distances between facial features, the ratios, and/or the positions of the individual's facial features and compare that data to the distribution of that ethnicity. Based on that comparison, the individual's apparent age and/or ethnicity may be determined. Additionally, the remote computing device 104 may alter the image to the desired simulated age by altering the shape of the individual's face (and making other adjustments described herein) to substantially match the features of the average person of that ethnicity using statistical ethnic shape, texture, and/or color models.

Facial landmarks that identify common points across individuals in 3D and/or 2D space may be placed on a captured image manually, for example, by selecting an appropriate location on the image. Additionally or alternatively, facial landmarks may be detected automatically by known methods such as Active Shape Models (ASM), Constrained Local Models (CLM), cascade classifiers, template matching, etc. Automatically detected landmarks may be further manually adjusted for accuracy through an interface that allows a user to interactively move the landmarks to their desired location.

It should be understood that the interface 630 of FIG. 6 (as well as the interfaces 730, 830, 930, and/or 1030 of FIGS. 7-10, respectively), may or may not be provided to the user. In some instances, these interfaces may be provided only to an administrator for maintenance and/or troubleshooting. In some instances, the interfaces 630, 730, 830, 930, and/or 1030 may not be accessible to a user. As such, these administrator interfaces are provided herein to illustrate a process that may be utilized for providing the described functionality.

Figure 7:
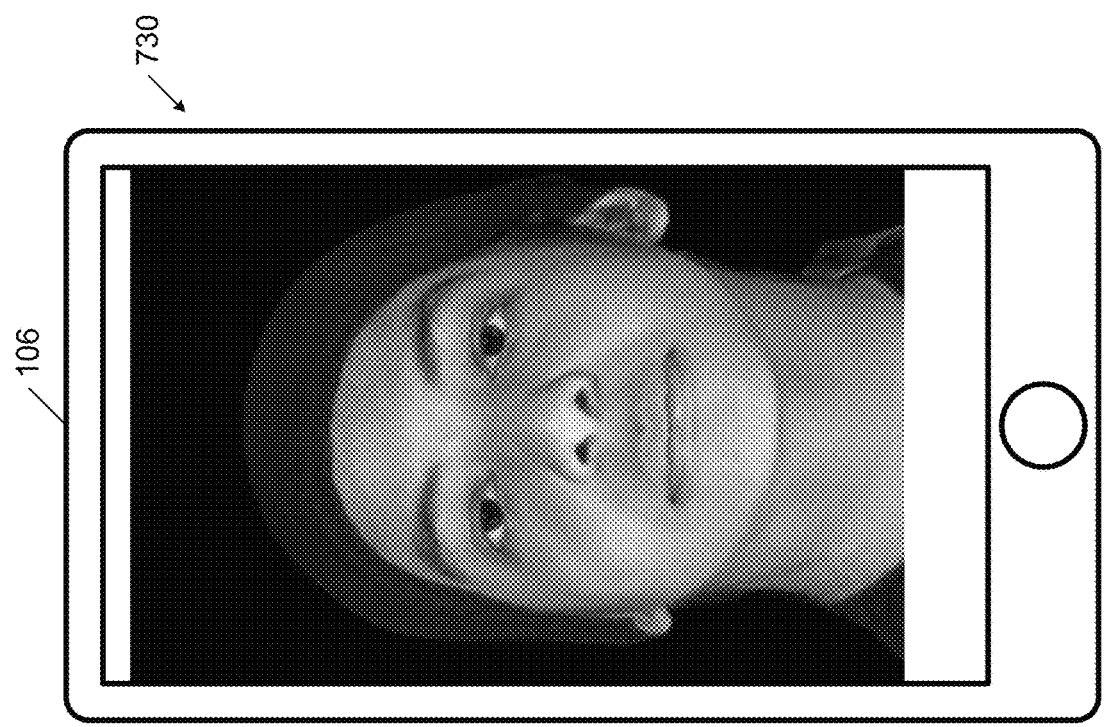
FIG. 7 depicts an interface for displaying texture of facial features based on age appearance prediction/simulation using a statistical ethnic texture model.

FIG. 7 depicts an exemplary interface 730 for applying shape changes of facial features based on age appearance simulation models. As illustrated, the interface 730 may provide a depiction of the image of an individual with a shape modification, based on the desired simulated age and the statistical ethnic shape models. Specifically, utilizing the exemplary landmark placement changes depicted in FIG. 6, the image in FIG. 6 may be modified to produce the result in FIG. 7. As an example, the modified (aged) image in the interface 730 has a wider mouth, eyes that sink, and a wider nose; the extent of which is determined by the model.

In some instances, a plurality of models can be created, such as a shape model, a color model, and a texture model. In some instances, the shape model may represent a manner in which the landmark points move according to age, representing such changes as weight gain, sagging of skin or other facial features, etc. In some instances, the color model may represent a manner in which the intensity values of each pixel change on average according to age, representing effects such as under eye dark circles, overall pigmentation changes, eye color changes, etc. In some instances, the texture model may represent a manner in which the intensity values of each pixel change with respect to relatively finer textural details of the skin, such as wrinkles and fine lines, hyper- and hypo-pigmented spots, and sun damage. The shape, color, and texture models return the expected landmark positions and pixel values, respectively, for a predetermined age. In some instances, such as when the image captured is a 3D image, these shape, color, and texture models represent 3D changes; for example, a 3D shape model may indicate how 3D changes in face shape or topology occur. A 3D color or texture model may indicate how color or texture change with respect to each triangle in a 3D triangular mesh.

In some instances, the shape model may be built by linear regression on the landmark points that have been symmetrically averaged and aligned through Generalized Procrustes Analysis (GPA). Landmarks may be aligned across an ethnic group population to account for rotation and/or shift across individuals. In some instances, images may be further aligned based on a vertical position of the eyes, such that an average vertical eye coordinate is common between the individual and a model. Other landmarks such as a top of the forehead or bottom of the neck may be detected to add additional landmarks to the population and images. For each X and Y landmark coordinate, a linear regression line may be fitted with age as the independent variable in the form:

$$P=M_{sh}*Age+B_{sh}$$

where P represents the predicted points at the given age, and $M_{sh}$ and $B_{sh}$ are the regression model weights and coefficients. Naturally, this shape model need not be limited to a linear regression model, but could be implemented with many other linear and/or non-linear prediction models such as a polynomial model, smoothing splines, MARS, neural network, etc. Furthermore, in the case of 3D image capture, this shape model may be built using landmark coordinates in 3D space, that is, X, Y, and Z coordinates.

In some instances, the color model may be built by performing a linear regression on the image pixel color values. However, the population images that are used to build the model may be aligned. This includes determining a population average face. The GPA aligned landmarks may be averaged together to produce the average landmark locations of the population. Then, for each individual's image, thin plate spline (TPS) warping may be used to distort the image by using the landmark locations as anchors and moving them from their original locations to those of the population average. TPS warping is a non-rigid transformation technique that uses radial basis functions to interpolate intermediate points to the anchors, which are then mapped to pixel color values. Once all images of all individuals have been warped to the mean face shape, a linear regression model for each pixel can be calculated, as the pixels may be aligned. This texture regression model could have the form:

$$I=M_{tx}*Age+B_{tx}$$

where the image I, and regression parameters $M_{tx}$ and $B_{tx}$ are matrices of size equal to that of the 3-channel RGB images (Width×Height×3). This color model predicts the pixel values making up the facial image for a given age.

In order to simulate aging or de-aging of a new image, both shape and color models can be applied for realism. It should be understood that the color model has been built relative to the mean landmark locations of the population, i.e., the "average face shape." Thus, the image predicted from the color model may be warped from the population mean landmark points to the desired landmark points for the aged/de-aged individual.

One method of applying the shape model is to compute the delta between the expected landmark coordinates at the desired age and the expected landmark coordinates at the individual's actual age (both according to the shape model), and then adding this delta to the individual's actual landmark coordinates, thus producing the predicted landmark coordinates of the individual at the desired age. Additionally, TPS can be used to warp the image of the individual by moving the actual coordinates to the location of the predicted coordinates. As will be understood, other methods of image warping may be used besides TPS, including, but not limited to, an affine or perspective transformation, elastic deformation, or other parametric or non-parametric methods.

Similarly, a delta can be computed using the color model between the expected color at the desired age and the expected color at the individual's actual age. This delta can likewise be added to the image to produce the predicted image. It should be understood that before adding the delta, the delta image must be warped to the predicted landmark points in order to line up with the warping of the individual's image from the shape model.

Figure 8:
FIG. 8 depicts an interface for applying a color change to an image for age appearance simulation using a statistical ethnic color model.

FIG. 8 depicts an exemplary interface 830 for viewing a color model to be applied to the captured image for age appearance simulation. As illustrated in FIG. 8, the interface 830 may represent an average color of an average person of the determined ethnicity for the desired simulated age. Accordingly, a mapping of the color may be applied to the image from FIG. 7 for further modification.

Figure 9:
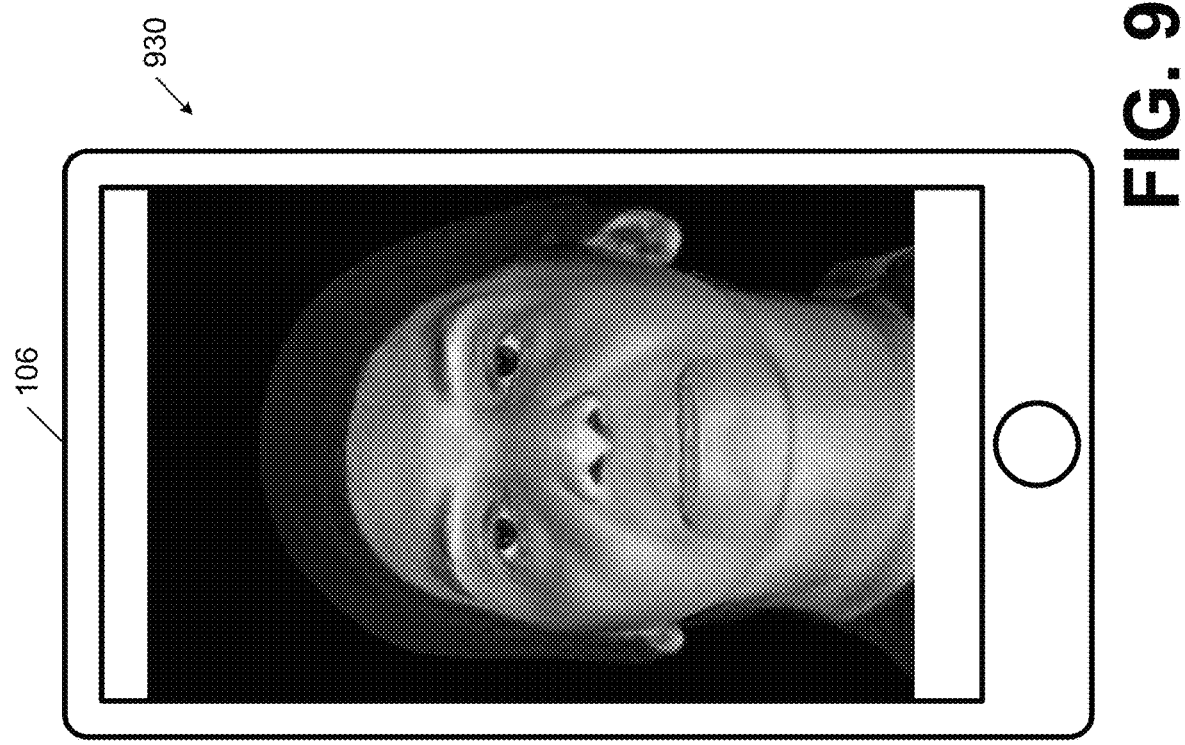
FIG. 9 depicts a user interface for applying a shape and/or color change to an image for age appearance simulation using a statistical ethnic shape and/or color model(s).

FIG. 9 depicts an exemplary interface 930 for viewing a color change to an image for age appearance simulation. As illustrated, the color map from FIG. 8 may be applied to the image from FIG. 7 to provide a further modified image that incorporates both shape change of facial features and color change of the face. As described above, the pixels in the image may be compared to the pixels in the image of an average person. Based on the comparison of the pixels, the pixels in the image may be altered to substantially match at least a portion of the image from FIG. 8. As an example, some embodiments may only compare color at areas of interest, such as those that experience shape change and/or predetermined landmark areas.

In some instances, the aging or de-aging simulation herein may be improved via a more sophisticated texture model in the wavelet domain to enhance textural features beyond what is possible with the color model method. For example, an image of an individual may be warped and decomposed into a smoothed wavelet pyramid. Linear regression may then be performed across a population for a plurality of pixels in each wavelet pyramid level to build a model to predict wavelet intensity versus age of the individual. A wavelet pyramid for the desired simulated age may be predicted using the wavelet pyramid regression model. Texture of the desired simulated age may be enhanced utilizing the predicted wavelet pyramid for the desired simulated age.

An expected delta shape change between the original age and the desired simulated age may be found using the shape regression model. This delta may be added to the actual shape of the individual's face in the image to find the aged shape of the individual. The image of the individual and other images that have been modified from the image may be warped to substantially match that of the aged shape. Likewise, a color difference between the original age and the desired simulated age may be added to the warped image to produce an aged image with a color delta. The texture of the color-delta image may be enhanced using the predicted wavelet pyramid.

FIG. 10 depicts an exemplary interface 1030 for providing a plurality of multi-level model textures in the wavelet domain for age appearance simulation. As illustrated in FIG. 10, the interface 1030 may be configured to provide texture changes in the images 1032, 1034, 1036 to illustrate changes of the average person of a particular ethnicity at various ages. This feature may be utilized to simulate wrinkles and other age features.

FIG. 11 depicts an exemplary user interface 1130 for a texture change to the image for age appearance simulation. In response to selection of the age simulator option 234 from FIG. 2, the interface 1130 may be provided. As illustrated, the user interface 1130 may be presented to the user and may provide a simulated image of the individual at a predetermined future age. The image provided in the user interface 1130 may be the result of applying the texture changes to the image from FIG. 9 (as well as the shape changes and/or color changes). The user interface 1130 may include a products option 1132 and/or a treatments option 1134. As described in more detail below, in response to selection of the products option 1132, one or more products may be recommended for treating the expected aging changes. In response to selection of the treatments option 1134, one or more treatment regimens may be recommended.

FIG. 12 depicts an exemplary user interface 1230 for purchasing products to help improve the appearance of aging skin. In response to selection of the products option 1132 from FIG. 11 (and/or the products option 236 from FIG. 2), the user interface 1230 may be provided. Based on the ethnicity, current age appearance, the expected aging, and/or other criteria, one or more products may be recommended to the user. Also provided are purchase options 1232, 1234, 1236 for purchasing one or more of the recommended products. In some instances, the user interface 1230 may include an option to purchase all of the recommended products with a single selection (e.g., a "purchase all" option).

FIG. 13 depicts an exemplary user interface 1330 for providing treatments, such as the recommended application of products or suggestions for medical procedures, to counter effects of predicted aging. In response to selection of the treatments option 1134 from FIG. 11 (and/or the treatments option 238 from FIG. 2), the user interface 1330 may be provided. Based on the actual age of the individual, the age progression, and/or other factors, one or more treatments may be recommended to the user. Also provided are a track progress option 1332, a simulate treatment option 1334, and a home option 1336. In response to selection of the track progress option 1332, the user may capture additional images of the individual to track progress of the age features and age appearance over time. This can show the user the effect of the treatment. In response to selection of the simulate treatment option 1334, the user computing device 102 may simulate the results of using the selected treatment(s) on the individual over time. In some instances, this may be implemented by building specific shape, color, and/or texture aging models using a population of only individuals who have used or have been provided the selected treatment(s), such as for example, products or procedures within the context of a clinical trial. An age simulated image showing the effect of the treatment may then be created using these treatment aging models. An age simulated image without use of the treatment may also be created using the standard population models. These two images may be compared by the user to see a simulation of aging with and without the treatment. In another instance, a single set of shape, color, and/or texture models may be built with duration of treatment (or similar product use frequency measurement) included as an additional independent variable to age. In this way, the models intrinsically represent the visual change with respect to age and treatment usage together. Simulated images may be created using such a model with or without treatment, or even with varying levels of treatment, for comparison by the user.

It should be understood that the systems and methods herein may be utilized to simulate intrinsic and extrinsic aging/de-aging. For example, the present systems and models may be utilized to simulate the extrinsic aging effects associated with certain user action, such as smoking, weight gain, weight loss, etc. As aging and/or de-aging simulation is applied to a plurality of years within a predetermined range, the resulting collection of images (e.g., the original captured image of the individual, a first altered image that represents a first desired simulated age, a second altered image that represents a second desired simulated age, etc.) may be combined into an animation. This may be utilized as a slideshow or video to show a prediction of the individual aging and/or de-aging. For a smooth animation through a plurality of ages, it may be desirable to generate a plurality of intermediary years in accordance with the statistical ethnic models herein. The present systems and methods develop smooth, continuous models for shape, color, and texture, which enables the creation of a continuous simulation to smoothly age/de-age an individual from a starting age to a final age through any and all intermediate ages, at whatever age resolution is desired (i.e. the age delta between subsequent frames of a video animation).

It should also be understood that aged texture may be applied without a smooth continuous texture model. For example, a shape model may be used to find an expected delta between the original age and the desired simulated age. This may be added to the true shape of the individual's face to find a target facial shape. An exemplary target individual may be selected whose age features will be extracted and added to the source individual. High frequency components of the target individual may be extracted. Additionally, these components may be warped to the target shape and applied to the warped image to produce the aged simulated image.

Figure 14:
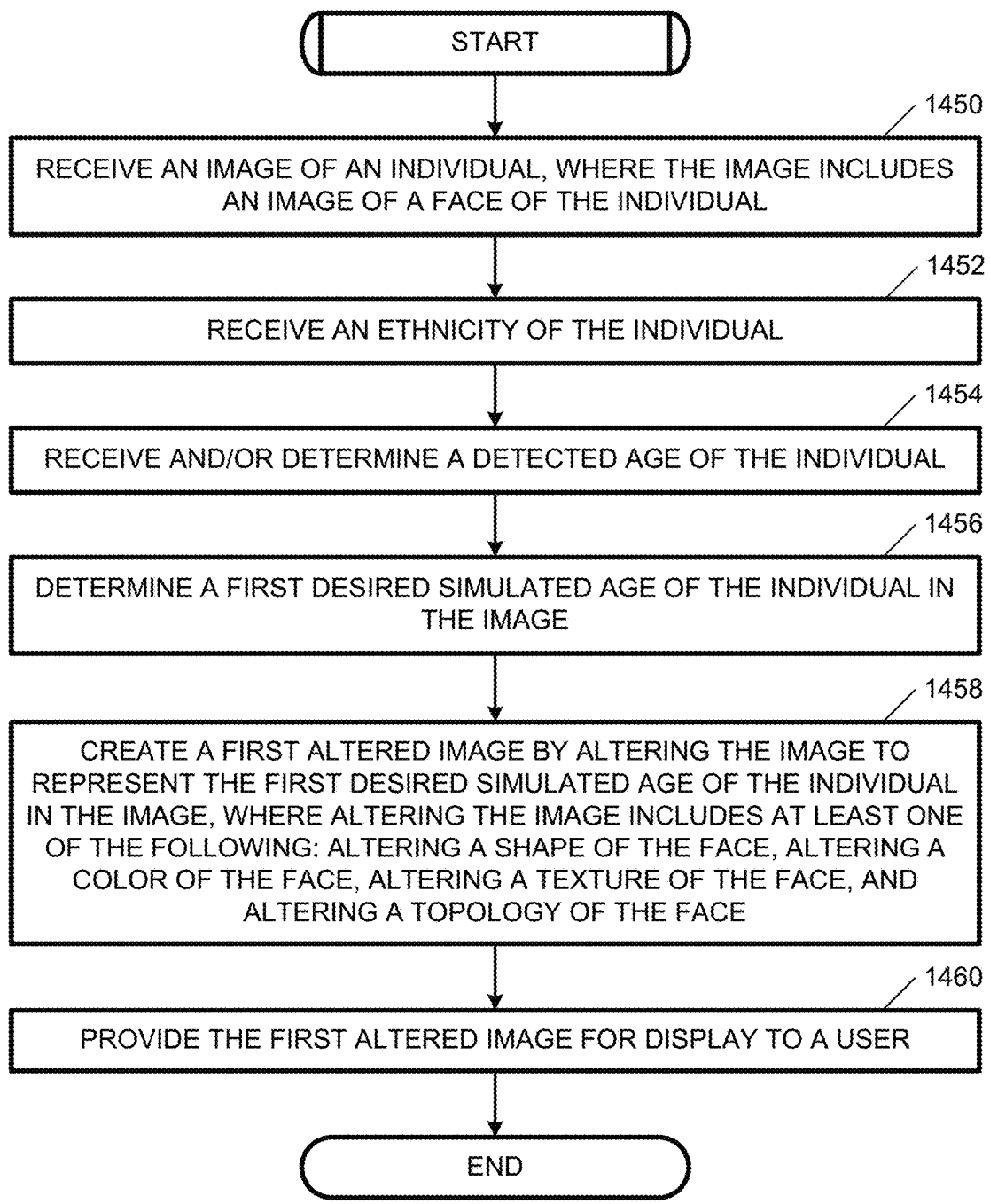
FIG. 14 depicts a flowchart for age appearance simulation.

FIG. 14 depicts a flowchart for exemplary age appearance simulation. As illustrated in block 1450, an image of an individual may be received, where the image includes the face of the individual. In block 1452, an ethnicity of the individual may be determined. In block 1454, an age of the individual may be determined. As will be understood, determining an age, ethnicity, and/or other feature may include processing data from an image to estimate the age (or "apparent age") or other feature. In some instances, determining an age, ethnicity, and/or other feature may include receiving input from a user to identify the corresponding data, such as receiving from the user the individual's actual age. In block 1456, a desired simulated age of the individual may be determined, such as by receiving the desired simulated age via user input. In block 1458, an altered image may be created by altering the image of the individual from block 1450 to represent the desired simulated age of the individual. Altering the image may include at least one of the following: altering a shape of the face, altering a color of the face, and altering a texture of the face. In block 1460, an altered image may be provided for display to a user.

Figure 15:
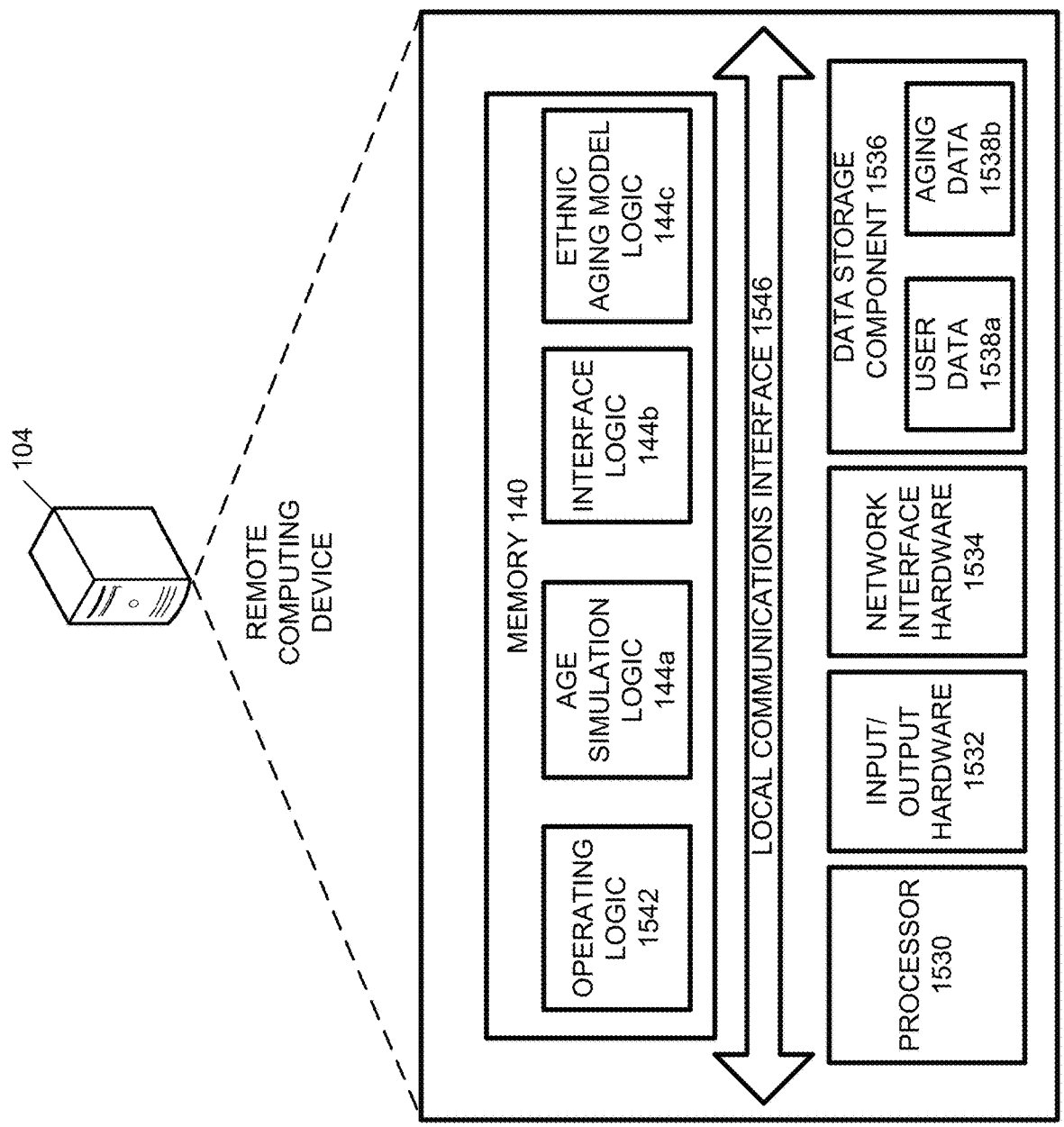
FIG. 15 depicts a remote computing device for age appearance prediction.

FIG. 15 depicts a remote computing device 104 for age appearance simulation. As illustrated, the remote computing device 104 includes a processor 1530, input/output hardware 1532, network interface hardware 1534, a data storage component 1536 (which stores user data 1538a, aging data 1538b, and/or other data), and the memory component 140. The memory component 140 may be configured as volatile and/or nonvolatile memory and as such, may include random access memory (including SRAM, DRAM, and/or other types of RAM), flash memory, secure digital (SD) memory, registers, Compact Discs (CD), Digital Versatile Discs (DVD), and/or other types of non-transitory computer-readable mediums Depending on the particular embodiment, these non-transitory computer-readable mediums may reside within the remote computing device 104 and/or external to the remote computing device 104.

The memory component 140 may store operating logic 1542, the age simulation logic 144a, the interface logic 144b, and the ethnic aging model logic 144c. The age simulation logic 144a, the interface logic 144b, and the ethnic aging model logic 144c may each include a plurality of different pieces of logic, each of which may be embodied as a computer program, firmware, and/or hardware, as an example. A local interface 1546 is also included in FIG. 15 and may be implemented as a bus or other communication interface to facilitate communication among the components of the remote computing device 104.

The processor 1530 may include any processing component operable to receive and execute instructions (such as from a data storage component 1536 and/or the memory component 140). The input/output hardware 1532 may include and/or be configured to interface with microphones, speakers, a display, and/or other hardware.

The network interface hardware 1534 may include and/or be configured for communicating with any wired or wireless networking hardware, including an antenna, a modem, LAN port, wireless fidelity (Wi-Fi) card, WiMax card, Bluetooth chip, USB card, mobile communications hardware, and/or other hardware for communicating with other networks and/or devices. From this connection, communication may be facilitated between the remote computing device 104 and other computing devices, such as the user computing device 102.

The operating logic 1542 may include an operating system and/or other software for managing components of the remote computing device 104. As also discussed above, the age simulation logic 144a may reside in the memory component 140 and may be configured to cause the processor 1530 to determine an age appearance of an individual and/or age progression simulation. Similarly, the interface logic 144b may be utilized to provide user interfaces, as described herein. The ethnic aging model logic 144c may be utilized to provide one or more of the ethnic aging models described herein.

It should be understood that while the components in FIG. 15 are illustrated as residing within the remote computing device 104, this is merely an example. In some instances, one or more of the components may reside external to the remote computing device 104. It should also be understood that, while the remote computing device 104 is illustrated as a single device, this is also merely an example. In some instances, the age simulation logic 144a, the interface logic 144b, and the ethnic aging model logic 144c may reside on different computing devices. As an example, one or more of the functionality and/or components described herein may be provided by a remote computing device 104 and/or user computing device 102, which may be coupled to the remote computing device 104 via the network 100.

Additionally, while the remote computing device 104 is illustrated with the age simulation logic 144a, the interface logic 144b, and the ethnic aging model logic 144c as separate logical components, this is also an example. In some instances, a single piece of logic may cause the remote computing device 104 to provide the described functionality.

In some instances, the present method may be implemented via an augmented or virtual reality experience, for example, with an augmented or virtual reality headset (e.g., Microsoft™ HoloLens™, Oculus Rift™, etc.). In an augmented or virtual reality experience, an individual may view and interact with a virtual 3D model of themselves after an aging/de-aging simulation. For example, a 3D image of the individual may be captured, and then the shape, color, and/or texture models herein may be applied to simulate aging or de-aging by a desired number of years. Product efficacy models may likewise be applied either separately or in conjunction with the aging simulation. Finally, the simulated 3D image of the individual may be projected into 3D augmented or virtual space for the individual to view and/or interact with.

In a similar manner, an aging/de-aging simulation could be applied in real-time to a video feed of the individual, which is then displayed back to the individual in a mirror-like fashion. The captured video would be used to construct a virtual 3D model of the individual, which is then simulated and projected back to the individual in some manner of display. In this way, an individual may move around to examine the simulated version of themselves as if looking in a mirror.

COMBINATIONS/EXAMPLES

A. A method for age appearance simulation of a consumer, comprising:
  (i) receiving an image of the consumer, wherein the image includes a face of the consumer;
  (ii) determining an ethnicity of the consumer;
  (iii) determining an apparent age of the consumer;
  (iv) determining a first desired simulated age of the consumer;
  (v) altering the image to represent the first simulated age of the consumer, wherein altering the image includes using ethnic aging model logic stored on a memory component of a computing device to alter at least one of a shape of the face, a color of the face, and a texture of the face to create a first altered image; and
  (vi) displaying the first altered image on an interface device.

B. The method of paragraph A, further comprising determining a shape in the image using facial landmarks, wherein altering the image includes altering a position of at least one facial landmark using statistical ethnic shape model logic stored on the memory component of the computing device.

C. The method of paragraph B, wherein altering the position of the facial landmark includes altering at least one of a direction and magnitude of the facial landmark based on a statistical analysis of a population of individuals of the same ethnicity as the consumer.

D. The method of any preceding paragraph, further comprising determining a texture in the image, wherein creating the first altered image includes using a statistical ethnic texture model to alter at least one of a movement of skin, the presence of a wrinkle, and the extent of the wrinkle.

E. The method of any preceding paragraph, further comprising determining the color of the image, wherein creating the first altered image includes using a statistical ethnic color model to alter at least one of the following: a color of the face, a color of hair, a color of an eyebrow, a color of an eye, the darkening of an under-eye dark circle, the presence of a visible spot, and the extent of a visible spot.

F. The method of any preceding paragraph, further comprising determining a second desired simulated age of the consumer; creating a second altered image that represents the second desired simulated age of the consumer using a statistical ethnic model; and creating an animation that represents aging or de-aging of the consumer using the first and second altered images.

G. The method of paragraph F, wherein the animation is presented as a video that includes intermediary ages between and the first and second desired simulation ages, which smoothly represents changes in shape, color, and/or texture.

H. The method of any preceding paragraph, further comprising determining a treatment for the consumer to undergo to affect the determined age of the consumer; and altering the image to represent results of the consumer undergoing the treatment.

I. The method of any preceding paragraph, wherein the ethnicity is specified by a user as a combination or a ratio of a plurality of ethnic groups and where a statistical ethnic model is likewise combined by the combination or the ratio.

J. The method of any preceding paragraph, further comprising storing the image and the first altered image for increasing accuracy of future predictions.

K. The method of any preceding paragraph, wherein the first altered image is provided to a user as an augmented reality experience or virtual reality experience such that the user may observe and interact with an aged version of the user in real time in augmented space or virtual reality space.

L. The method of any preceding paragraph, wherein determining the apparent age of the consumer comprises using logic stored on the computing device to determine at least one of a distance of a facial landmark from another position on the image and a ratio related to a distance of a facial landmark from another position on the image, and comparing the distance or ratio to an average for a person of the same ethnicity as the consumer.

M. The method of any preceding paragraph, wherein the image of the consumer is captured by an image capture device coupled to the computing device.

N. The method of paragraph M, wherein the computing device, the interface device, and the image capture device are part of a unitary device.

O. The method of any preceding paragraph, wherein the image is preprocessed to remove extraneous objects.

P. The method of any preceding paragraph, wherein the ethnic aging model logic is based on a statistical analysis of individuals of the same gender as the consumer.

Q. The method of claim 1, further comprising converting a three-dimensional image into a two-dimensional projection of the three-dimensional image to provide the image of the consumer.

R. The method of any one of paragraphs A to M or O to Q, wherein the computing device and the interface device are remotely located from one another.

While certain examples and embodiments herein may have been described with regard to facial features and landmarks, it is to be appreciated that such models and techniques may also be extended to other landmarks throughout the rest of the body, such as shoulders, elbows, hands, fingers, knees, feet, etc. In such a manner, shape, color, and/or texture changes may be applied to the entire body for a full body simulation, as would be desired in some augmented or virtual reality embodiments.

All numeric ranges described herein are inclusive of narrower ranges; delineated upper and lower range limits are interchangeable to create further ranges not explicitly delineated. Embodiments described herein can comprise, consist essentially of, or consist of, the essential components as well as optional pieces described herein. As used in the description and the appended claims, the singular forms "a," "an," and "the" are intended to include the plural forms as well, unless the context clearly indicates otherwise.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm"

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for age appearance simulation of a consumer, comprising:
    receiving an image of the consumer, wherein the image includes a face of the consumer;
    determining an ethnicity of the consumer;
    determining an age of the consumer;
    determining a first desired simulated age of the consumer;
    determining a plurality of landmarks in the image;
    creating a first altered image by altering the image to represent the first desired simulated age of the consumer, wherein altering the image includes using a statistical ethnic shape model to alter a shape of the face; and
    providing the first altered image for display to a user, wherein creating the first altered image includes:
        using the statistical ethnic shape model to determine first expected positions of the plurality of landmarks for an average person of the ethnicity and age of the consumer,
        using the statistical ethnic shape model to determine second expected positions of the plurality of landmarks for an average person of the ethnicity and first desired simulated age of the consumer, and
        altering the shape of the face in accordance with a difference between the first and second expected positions of the plurality of landmarks.

2. The method of claim 1, further comprising determining a texture in the image, wherein creating the first altered image includes using a statistical ethnic texture model to alter at least one of a movement of skin, the presence of a wrinkle, and the extent of the wrinkle.

3. The method of claim 1, wherein creating the first altered image includes using a statistical ethnic color model to alter at least one of the following: a color of the face, a color of hair, a color of an eyebrow, a color of an eye, the darkening of an under-eye dark circle, the presence of a visible spot, and the extent of a visible spot.

4. The method of claim 1, further comprising determining a second desired simulated age of the consumer; creating a second altered image that represents the second desired simulated age of the consumer using a statistical ethnic model; and creating an animation that represents aging or de-aging of the consumer using the first and second altered images.

5. The method of claim 4, wherein the animation is presented as a video that includes intermediary ages between the first and second desired simulation ages, which smoothly represents a change in shape and texture.

6. The method of claim 1, further comprising determining a treatment for the consumer to undergo to affect the determined age of the consumer; and altering the image to represent results of the consumer undergoing the treatment.

7. The method of claim 1, wherein the ethnicity is specified by a user as a combination or a ratio of a plurality of ethnic groups and where a statistical ethnic model is likewise combined by the combination or the ratio.

8. The method of claim 1, further comprising storing the image and the first altered image for increasing accuracy of future predictions.

9. The method of claim 1, wherein the first altered image is provided to a user as an augmented reality experience or virtual reality experience such that the user may observe and interact with an aged version of the user in real time in augmented space or virtual reality space.

10. The method of claim 1, wherein the image of the consumer is captured by an image capture device coupled to the computing device.

11. The method of claim 10, wherein the computing device, the interface device, and the image capture device are part of a unitary device.

12. The method of claim 1, wherein the computing device and the interface device are remotely located from one another.

13. The method of claim 1, wherein the image is preprocessed to remove extraneous objects.

14. The method of claim 1, wherein the ethnic aging model logic is based on a statistical analysis of individuals of the same gender as the consumer.

15. The method of claim 1, further comprising converting a three-dimensional image into a two-dimensional projection of the three-dimensional image to provide the image of the consumer.

* * * * *